United States Patent [19]
Maraschin et al.

[11] Patent Number: 5,805,408
[45] Date of Patent: Sep. 8, 1998

[54] ELECTROSTATIC CLAMP WITH LIP SEAL FOR CLAMPING SUBSTRATES

[75] Inventors: Robert Maraschin, Cupertino; Paul Kevin Shufflebotham, San Jose; Michael Scott Barnes, San Francisco, all of Calif.

[73] Assignee: Lam Research Corporation, Fremont, Calif.

[21] Appl. No.: 577,265

[22] Filed: Dec. 22, 1995

[51] Int. Cl.⁶ .................................................. H02N 13/00
[52] U.S. Cl. ............................................................ 361/234
[58] Field of Search .................................. 361/233, 234; 269/8, 903; 279/128

[56] References Cited

U.S. PATENT DOCUMENTS

| | | |
|---|---|---|
| 4,340,462 | 7/1982 | Koch . |
| 4,534,816 | 8/1985 | Chen et al. . |
| 4,579,618 | 4/1986 | Celestino et al. . |
| 4,615,755 | 10/1986 | Tracy et al. . |
| 4,665,463 | 5/1987 | Ward et al. . |
| 4,692,836 | 9/1987 | Suzuki . |
| 4,948,458 | 8/1990 | Ogle . |
| 5,013,400 | 5/1991 | Kurasaki et al. . |
| 5,055,964 | 10/1991 | Logan et al. . |
| 5,103,367 | 4/1992 | Horwitz et al. ........................... 361/234 |
| 5,160,152 | 11/1992 | Toraguchi et al. . |
| 5,200,232 | 4/1993 | Tappan et al. . |
| 5,238,499 | 8/1993 | van de Ven et al. . |
| 5,262,029 | 11/1993 | Erskine et al. . |
| 5,292,399 | 3/1994 | Lee et al. . |
| 5,326,725 | 7/1994 | Sherstinsky . |
| 5,350,479 | 9/1994 | Collins et al. . |
| 5,452,177 | 9/1995 | Frutiger .................................... 361/234 |
| 5,636,098 | 6/1997 | Salfelder et al. ........................ 361/234 |

FOREIGN PATENT DOCUMENTS

0439000 A1  7/1991  European Pat. Off. .

OTHER PUBLICATIONS

*Reactive Ion Etching Technology In Thin–Film–Transistor Processing,* Y. Kuo, IBM J. Res. Develop., vol. 36, No. 1 (Jan. 1992), pp. 69–75.

*Primary Examiner*—Fritz Fleming
*Attorney, Agent, or Firm*—Burns, Doane, Swecker & Mathis, L.L.P.

[57] ABSTRACT

An electrostatic clamping apparatus with lip seal for holding substrates in a vacuum processing chamber. The apparatus includes an electrostatic clamp, a sealing member surrounding the electrostatic clamp, and an edge ring surrounding the sealing member and holding the sealing member in place against the electrostatic clamp. The sealing member provides a seal between the electrostatic clamp and the substrate. This seal prevents the leakage of temperature control gas into the processing chamber and prevents process gas from reaching the electrostatic clamp and/or causing arcing in the chamber. In addition, by leaving a small gap between the sealing surface of the resilient sealing member and the edge of the electrostatic clamp, a helium distribution channel is created outside the electrostatic clamp top surface thus maximizing available contact area between the substrate and the clamp.

32 Claims, 2 Drawing Sheets

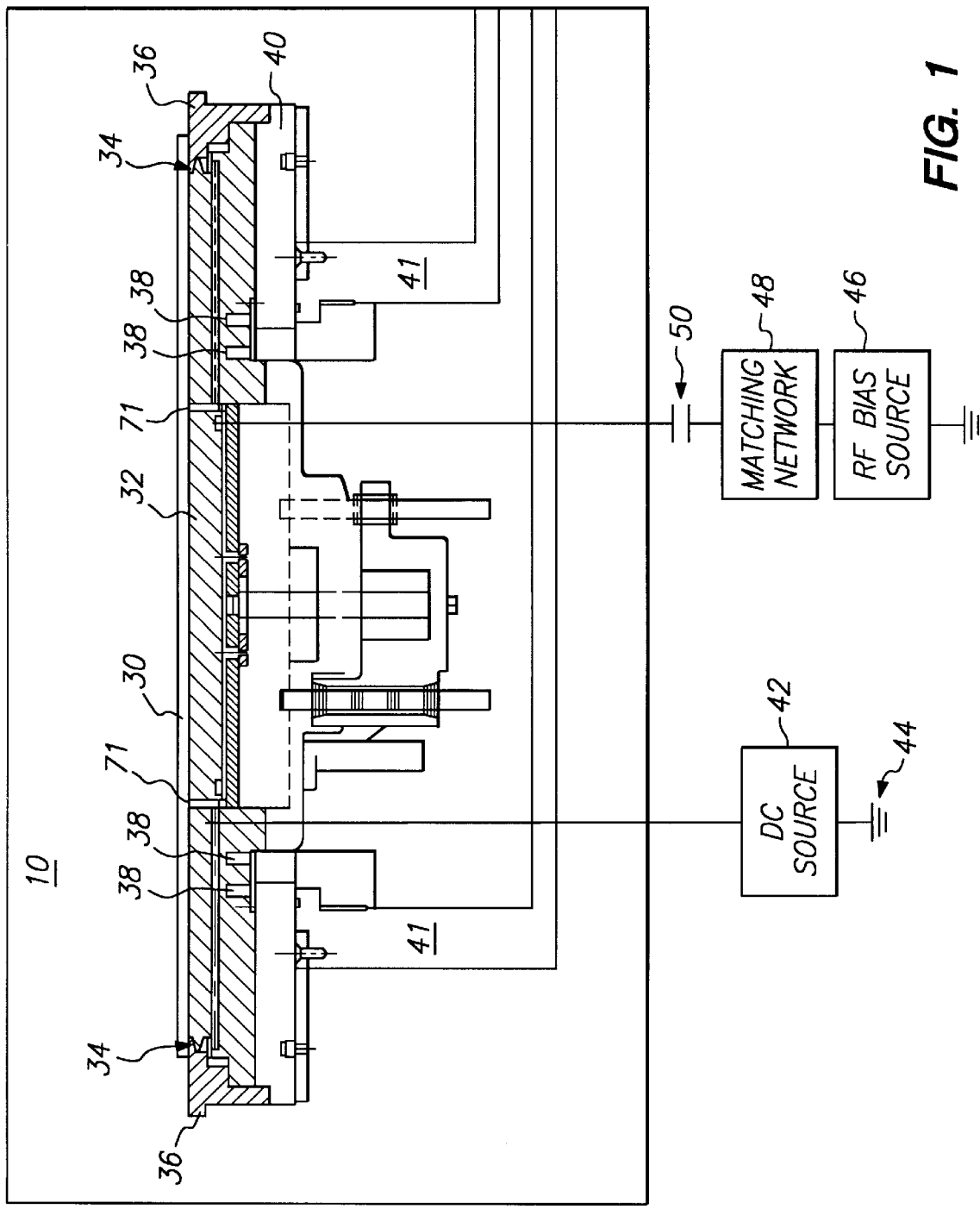

ELECTROSTATIC CLAMP WITH LIP SEAL FOR CLAMPING SUBSTRATES

FIELD OF THE INVENTION

The present invention relates to an apparatus for clamping substrates in vacuum processing chambers, and more particularly, to an apparatus employing an electrostatic clamp and a resilient seal for clamping a substrate in a vacuum processing chamber.

DESCRIPTION OF THE RELATED ART

Vacuum processing chambers are generally used for etching and chemical vapor depositing (CVD) of materials on substrates by supplying an etching or deposition gas to the vacuum chamber and application of an RF field to the gas. Examples of parallel plate, transformer coupled plasma (TCP), and electron-cyclotron resonance (ECR) reactors are disclosed in commonly owned U.S. Pat. Nos. 4,340,462; 4,948,458; and 5,200,232. The substrates are held in place within the vacuum chamber during processing by substrate holders. Conventional substrate holders include mechanical clamps and electrostatic clamps (ESC). Examples of mechanical clamps and ESC substrate holders are provided in commonly owned U.S. Pat. No. 5,262,029 and commonly owned U.S. application Ser. No. 08/401,524 filed on Mar. 10, 1995. Substrate holders in the form of an electrode can supply radiofrequency (RF) power into the chamber, as disclosed in U.S. Pat. No. 4,579,618.

Mechanical clamps generally employ a clamp ring which surrounds the substrate and presses down on the top surface of the substrate around its periphery. Further examples of mechanical clamping rings are disclosed in U.S. Pat. Nos. 4,615,755; 5,013,400; and 5,326,725. Due to the fact that these known mechanical clamps cover the edge portions of the substrate, mechanical clamps reduce the area of the substrate which is able to be processed. Some additional drawbacks of mechanical clamps are that the clamp ring may cause damage to the edge of the substrate or may cause particles to become dislodged and contaminate the substrate in the chamber. Although mechanical clamps are suitable for use in many applications with small substrates, when large substrates such as flat panel displays are processed using mechanical clamps, the panels may have a tendency to become bowed due to the supply of pressurized gas used for increasing thermal conduction between the substrate and the water cooled substrate holder.

Substrates used to make flat panel displays may have dimensions of about 320 mm×340 mm, 360 mm×465 mm, or as large as 600 mm×720 mm with thicknesses of 0.7 mm or 1.1 mm and such substrates can be used for lap top computer screens. A discussion of flat panel display processing can be found in an article by Y. Kuo entitled "Reactive ion etching technology in thin-film-transistor processing," IBM J. Res. Develop., V. 36, No. 1, January 1992. In the past, these large flat panel display substrates have been held in place in processing chambers by the use of mechanical clamps. However, mechanical clamps have the disadvantages discussed above.

Substrates including flat panel displays and smaller substrates can be cooled by the substrate holder during certain processing steps. Such cooling is performed by the application of an inert gas, such as helium, between the substrate holder and the opposed surface of the substrate. For instance, see U.S. Pat. Nos. 5,160,152; 5,238,499; 5,350,479; and 4,534,816. The cooling gas typically fills channels or a pattern of grooves in the substrate holder and applies a back pressure to the substrate which tends to cause the substrate to become bowed upward at the center when the substrate is held only along the edges by a mechanical clamping apparatus. This bowing effect is even more pronounced for large substrates such as the type used to make flat panel displays. The bowing of the panel is undesirable since it causes non-uniform heat transfer to the substrate holder thus adversely affecting the processing of the panel.

Electrostatic chucks are used for holding semiconducting and conducting substrates in place in a vacuum chamber in situations where it is desirable to avoid a clamping ring which extends over a portion of the substrate upper surface. Electrostatic chucks of the monopolar type utilize a single electrode. For instance, see U.S. Pat. No. 4,665,463. Electrostatic chucks of the bipolar type utilize mutual attraction between two electrically charged capacitor plates which are separated by a dielectric layer. For instance, see U.S. Pat. Nos. 4,692,836 and 5,055,964. An electrostatic chuck generally comprises an electrode with a dielectric layer formed on the electrode. A substrate of conductive or semiconductive material which is placed on the dielectric layer is attracted toward the electrode. Although this electrostatic attraction can be obtained between semiconducting and conducting substrates and an electrostatic chuck, this type of electrostatic attraction cannot be obtained with dielectric materials. With respect to conducting and semiconducting substrates, electrostatic chucks are beneficial because they exert a holding force on the entire substrate which counteracts the force of the cooling gas applied to the back of the substrate and does not cause the substrate to bow or warp.

The benefits of an electrostatic chuck would be highly desirable for use with flat panel displays. However, because flat panel displays are generally made of non-conductive materials, such as glass, conventional electrostatic chucks cannot be used.

SUMMARY OF THE INVENTION

The present invention provides a resilient sealing member for an electrostatic clamp which clamps individual substrates such as dielectric substrates. The resilient sealing member can be used with various types of electrostatic clamps which support a substrate in a chamber wherein the substrate is processed. The resilient sealing member allows maximum contact area between the clamp and the substrate, minimizes the chance of arcing of the electrostatic clamp by inhibiting plasma from contacting the clamp, prevents contamination of process gas in the chamber by temperature control gas supplied to the underside of the substrate, and/or avoids particle contamination of the substrate upper surface by particles in the clamp housing.

According to one aspect of the invention a clamping apparatus for clamping a dielectric substrate in a vacuum processing chamber includes an electrostatic clamp which can apply a DC electrostatic charge to the substrate to hold the substrate to an upper surface of the electrostatic clamp, an edge ring surrounding the electrostatic clamp and having an upper surface which is substantially co-planar with the upper surface of the electrostatic clamp, and a resilient sealing member provided between the electrostatic clamp and the edge ring and arranged to provide a seal between the electrostatic clamp and the substrate.

According to another aspect of the invention a method is provided wherein a substrate is processed by clamping a substrate in a vacuum processing chamber including an electrostatic clamp which applies an electrostatic charge to the substrate to hold the substrate to an upper surface of the electrostatic clamp, and a resilient sealing member surrounding the electrostatic clamp provides a gas tight seal between the electrostatic clamp and a lower surface of the substrate during processing of the substrate.

BRIEF DESCRIPTION OF THE DRAWINGS

The invention will be described in greater detail with reference to the accompanying drawings in which like elements bear like reference numerals, and wherein:

FIG. 1 is a schematic view of a vacuum processing chamber according to the present invention;

DETAILED DESCRIPTION OF THE PREFERRED EMBODIMENTS

A vacuum processing chamber according to the present invention may be used for various semiconductor plasma processing steps such as etching, deposition, resist stripping, etc. An example of a vacuum processing chamber 10 is shown in FIG. 1 wherein a processing gas is supplied by suitable apparatus such as gas distribution rings, showerhead electrode, etc. to the processing chamber 10 and a vacuum is maintained in the interior of the chamber by suitable vacuum pump apparatus. The vacuum processing chamber can be supplied RF power through an external coil outside the chamber. However, the reactor can be of any other type of plasma reactor such as that of an ECR reactor, parallel plate reactor, helicon reactor, etc.

Figure 2:
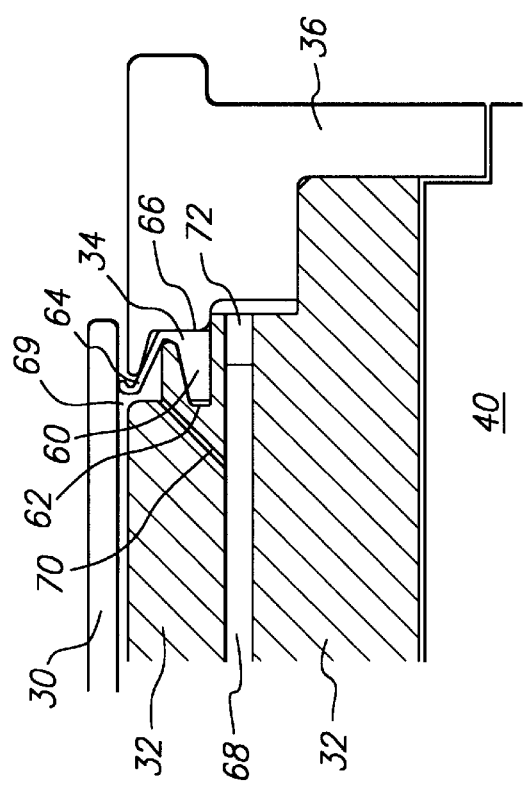
FIG. 2 is a cross-sectional view of the present invention with the sealing member in an uncompressed position.
Figure 3:
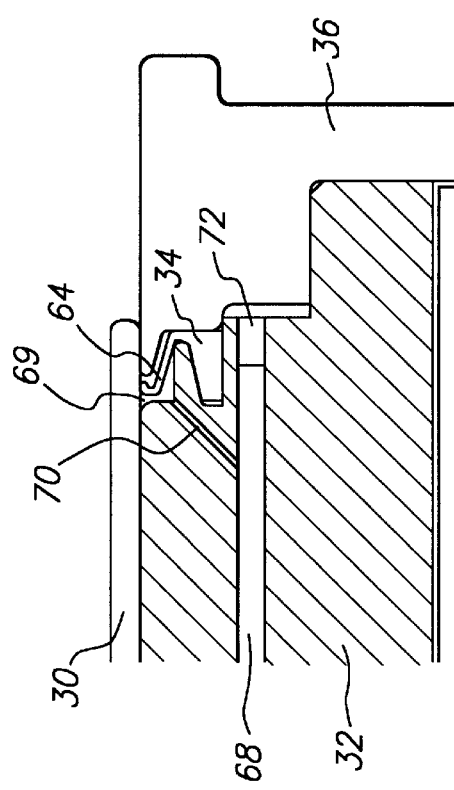
FIG. 3 is a cross sectional view of the present invention with the sealing member in a compressed position.

A substrate 30 according to the present invention is mounted within the chamber by a mounting apparatus which includes an electrostatic clamp 32 and a sealing member 34, which is seen more clearly in FIGS. 2 and 3. The sealing member 34 is held in place by a ceramic edge ring 36 which also electrically insulates the clamp 32 from the interior of the chamber 10. The electrostatic clamp 32 can be monopolar and consist of an electrically conductive material such as aluminum containing water cooling channels 38, mounted within the chamber and grounded to a portion of the chamber.

The sealing member 34 can be used with various types of clamping systems such as monopolar and bipolar electrostatic chucks. In particular, the sealing member can be used with a monopolar or multi-polar ESC in a plasma or non-plasma environment. Thus, while a specific embodiment of the invention is described below with reference to a monopolar chuck used to hold dielectric substrates in a plasma environment, other chucking systems can also be used with the sealing member. For instance, the sealing member can be used in conjunction with (1) a monopolar ESC or a bipolar, multi-polar or flux-line ESC for holding semiconductor wafers or dielectric substrates in a plasma, non-plasma, vacuum or non-vacuum environment or (2) a monopolar ESC for holding dielectric substrates in a plasma environment wherein the plasma is not used to supply ions to the substrate surface for purposes of clamping but rather, the plasma completes an electrical circuit between the monopolar ESC and a grounded surface such as part of the wall of the plasma processing chamber. In the case of a non-plasma environment and/or in the case of an ESC which does not provide underside gas cooling of the substrate, the sealing member can be used to protect the ESC from build-up of foreign matter, prevent particles in the ESC housing from contaminating the substrate and/or prevent process gas within the chamber from attacking the ESC. In the case of gas cooling of the substrate, the sealing member also prevents leakage of the cooling gas into the chamber. The clamp can have a rectangular, square, circular or other shape suitable for clamping the particular substrate to be clamped.

The electrostatic clamp 32 according to one embodiment of the present invention, as shown in FIG. 1, is a high voltage monopolar electrostatic clamp which is rectangular in shape and adapted to hold large workpieces made of dielectric, non-plastic, materials such as the glass sheets (e.g., Corning 7059) used in flat panel displays. The electrostatic clamp 32 is connected to a high voltage terminal of a DC source 42 and a ground terminal 44 of the DC source is suitably grounded, such as to a side wall of the chamber.

In operation, a dielectric substrate 30 is positioned on the electrostatic clamp 32 and plasma is generated in the chamber 10. The plasma provides an electrical circuit from the substrate to ground (such as to chamber walls) and supplies a charge to the substrate surface which results in accumulation of ions on the substrate surface. Thus, when the high voltage DC source 42 supplies a voltage of −4000 to −5000 volts to the electrostatic clamp, the high voltage charge across the substrate 30 creates an attractive force which causes ions (previously provided to the upper surface of the substrate 30 by the plasma) to be attracted to the clamp 32. The force exerted on the accumulated ions by the electrostatic clamp acts as an electrostatic clamping force to hold the dielectric substrate to the electrostatic clamp. The electrostatic clamping force created by the electrostatic clamp 32 should be of sufficient strength to overcome the upward force of helium gas supplied between the substrate and the electrostatic clamp.

An RF bias voltage source 46 is connected via a matching network 48 and one or more DC blocking capacitors 50 to the electrostatic clamp 32 for ion energy control. The voltage applied to the electrostatic clamp 32 by the DC source 42 must be sufficiently high to cause the desired clamping force, typically on the order of at least 4000 volts. The actual voltage needed will depend on factors such as the size and thickness of substrate 30, the thickness of any dielectric layer such as an anodized coating on the clamp 32, etc. The operation of a monopolar electrostatic clamp which can be used as clamp 32, is described in greater detail in commonly owned U.S. patent application Ser. No. 08/542,958, filed on Oct. 13, 1995, a continuation-in-part of Ser. No. 08/536,923 filed on Sept. 29, 1995, the disclosures of which are hereby incorporated by reference.

The electrostatic clamp which is described in the co-pending patent application has four disadvantages which are addressed by the present invention. First, with the very high voltage of the electrostatic clamp 32 which is required to create the desired clamping force on a dielectric substrate, there is a risk of arcing from the electrostatic clamp to the plasma within the chamber. Arcing can occur when the plasma from the chamber comes into contact with the electrostatic clamp. Second, there is a reduced etch rate in areas above lift pin holes and helium distribution grooves in the top surface of the electrostatic clamp 32 to distribute helium to the underside of the substrate for temperature control. This reduced etch rate occurs because the holes and grooves act as small capacitors having high RF impedances which reduce the local RF field at the surface of the substrate directly above the holes and grooves. This results in a lower etch rate above the holes and grooves when ion-driven plasma etch processes are performed in the chamber. Thus, the resulting etched substrate can include undesirable non-uniformities caused by the lift pin holes and/or helium distribution grooves.

Third, due to the large periphery of the substrates used in flat panel processing, a large amount of helium supplied to the grooves in the electrostatic clamp beneath the substrate can leak into the chamber and contaminate the process gas. With small circular substrates (e.g., 6 and 8 inch wafers) the leakage can often be reduced to acceptable levels by increasing the sealing land width between the outermost circumferential helium groove and the edge of the electrostatic clamp. However, in flat panel processing the width of the land cannot be made wide enough to sufficiently reduce the helium leakage without resulting in an insufficiently cooled region around the edge of the panel.

Finally, the sealing member prevents chemical attack of the top edge of the electrostatic clamp by chemical species in the plasma, where chemical attack could include either corrosion of, or deposition on, the electrostatic clamp.

According to the present invention these drawbacks of the electrostatic clamp for holding dielectric substrates have been addressed by providing a resilient sealing member 34 around the edge of the electrostatic clamp 32 and an edge ring 36 which holds the sealing member 34 in place. The present invention has been described for use with a high voltage electrostatic clamp for clamping large dielectric substrates. However, the present invention is equally applicable for use with conventional low voltage monopolar or bipolar electrostatic clamps.

An enlarged view of the electrostatic clamp 32 with the resilient sealing member 34 is shown in FIGS. 2 and 3. The resilient sealing member 34 includes a base portion 60 which is wedge shaped in cross-section and is configured to fit in a groove 62 formed in the outer surface of the electrostatic clamp 32. The base portion 60 is pressed tightly in the groove 62 by an inner surface 66 of the edge ring 36. A flexible upper portion 64 of the sealing member 34 is connected to an outer edge of the base portion 60. The flexible upper portion 64 is S-shaped and has a free end which is positioned to resiliently engage the substrate 30. The resilient sealing member 34 is preferably formed of silicone. However, other O-ring type materials, such as "TEFLON," "VITON," and "KALRAZ" available from DuPont, "KEL-F" available for 3M and "CHEMRAZ" available from Greene Tweed & Co., Inc., may also be used for member 34. The exact choice of material depends on the temperature range and chemical environment expected in the processor.

As shown in FIG. 2, the flexible upper portion of 64 of the sealing member 34 extends between and upwardly above the substantially co-planar upper surfaces of the electrostatic clamp 32 and the edge ring 36. When the electrostatic clamp 32 is turned on, the substrate 30 is forced down against the electrostatic clamp and against the resilient sealing member 34 which causes the flexible portion 64 to deflect and form a fluid tight seal between the substrate 30 and the electrostatic clamp 32, as shown in FIG. 3.

The electrostatic clamp 32 is also provided with channels 68 through which helium or another noble gas is supplied to a space between the substrate and the clamp 32. The helium channels extend completely through the clamp 32 and are closed at opposite ends by plugs 72. The helium is delivered to a space between sealing member 34 and an outer edge of the electrostatic clamp 32 through upwardly angled channels 70 which connect channels 68 to a small gap 69 between the electrostatic clamp 32 and the resilient sealing member 34. The present invention provides an improvement over electrostatic clamps having helium supply channels opening in the upper surface of the clamp in that the clamp 32 can be supplied helium from the gap 69 thus providing a clamp upper surface which is continuous and only interrupted by lift pin holes 71. Further, it is not necessary to provide grooves in the upper surface to distribute the helium. Instead, the helium cooling gas may be circulated over the entire surface of the electrostatic clamp simply by making the upper surface of the electrostatic clamp rough such as by anodizing or machining or bead-blasting so that the helium has microscopic passages through which to fill the space between opposed surfaces of the clamp 32 and substrate 30.

The electrostatic clamp 32 is electrically isolated from wall portion 41 of the processing chamber by insulator 40 and by the edge ring 36 which is formed of an insulating material. The insulating material of the insulator 40 and the edge ring 36 is preferably ceramic. However, other insulator materials suitable for use in plasma reactor environments can be used.

The addition of the resilient sealing member 34 outside the edge of the electrostatic clamp 32 accomplishes several benefits. First, the leakage of helium into the processing chamber 10 is reduced to negligible amounts, avoiding a substantial source of process gas contamination. Second, process gas and plasma is physically prevented from reaching the electrostatic clamp 32, therefore, the chance for arcing, high leakage currents or chemical attack to occur are greatly reduced. Third, by leaving a small gap between the sealing surface of the resilient sealing member 34 and the edge of the electrostatic clamp 32, a helium distribution channel is created outside the electrostatic clamp top surface. Thus, not only is the need for helium supply holes and distribution grooves in the top surface of the electrostatic clamp eliminated, but the sealing land is also eliminated allowing cooling to occur all the way to the edge of the electrostatic clamp. Finally, the edge exclusion region of the substrate 30 where no contact with cooling gas occurs is reduced to the size required to accommodate substrate placement tolerances and the width of the resilient sealing member's contact surface.

Figure 4:
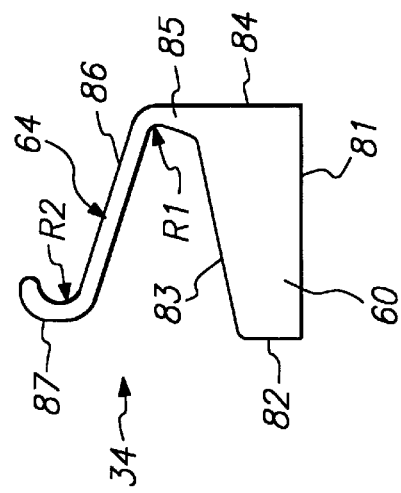
FIG. 4 shows details of a cross section of the sealing member.

One embodiment of sealing member 34 is shown in FIG. 4. As shown, base portion 60 is defined by bottom wall 81, side wall 82, inclined wall 93 and side wall 84. The deflectable portion 64 includes lower portion 85, arm 86, and tip portion 87. Lower portion 85 and inclined wall 83 form an angle of 130°. Lower portion 85 is joined to arm 86 by a curved section of radius R1. Tip portion 87 includes a curved section of radius R2. Although dimensions and configurations of sealing member 34 will depend on choice of material for sealing member 34 and particular chuck designs, a presently preferred design is as follows.

The sealing member 34 shown in FIG. 4 can have the following dimensions. Overall, the height can be 0.401 inch and the width of wall 81 can be 0.345 inch. Wall 82 can have a height of 0.091 inch and wall 84 can have a height of 0.207 inch. Lower portion 85 can have a height of 0.025 inch and arm 86 can have a thickness of 0.025 inch. Wall 83 can be inclined at 11.6°, arm 86 can be inclined at 16.9°, R1 can be 0.015 inch and R2 can be 0.030 inch. The seal is preferably molded (rather than extruded) to a mold having the shape of the electrostatic chuck. Such a molded sealing member can ensure proper sealing around corners of rectangular (or other non-round) surfaces of the electrostatic chuck.

The shape of the sealing member is advantageous in several ways. For instance, since the deflectable portion 64 is attached to an outer side of the base portion 60, the deflectable portion 64 moves vertically towards and away from the base portion 60 which occupying a compact space. This arrangement obviates the need for a He channel in the outer periphery of the upper surface of the clamp and maximizes the area of contact between the substrate and electrostatic chuck. Moreover, the arm 86 extends inwardly so as to be pressurized by the cooling He gas (e.g., 2–30 Torr) in space 69. As a result, the He pressure urges arm 86 toward the substrate 30 and provides a pressure tight seal between tip 87 and substrate 30. Tip 87 is curved outwardly away from electrostatic chuck 32 so that maximum contact is achieved between tip 87 and the underside of substrate 30 even during movement of the deflectable portion 64. The deflectable portion 64 also provides a slight upward pressure on the substrate 30 such that the weight of the substrate collapses the deflectable portion or the substrate is held no more than about 0.008 inch above the electrostatic chuck. Otherwise, if the deflectable portion holds the substrate too far above the electrostatic clamp, the clamp may not be capable of generating enough of an attractive force on the substrate to electrostatically clamp the substrate against the upper surface of the clamp.

In summary, the sealing member according to the invention balances a number of delicate requirements while providing a compact sealing arrangement. For instance, the sealing device engages the wafer above the surface of the electrostatic clamping device and deflects sufficiently under the weight of a semiconductor wafer to position the wafer within a small distance from the face of the clamping device so as to be within the operating range of the clamping device. If the wafer was held outside the narrow height range, the electrostatic forces induced in the wafer may not be sufficient to pull the wafer into the clamped state. On the other hand, it is desired that the sealing device provide enough of a force acting on the wafer to provide a fluid type seal. The sealing device according to the invention adequately balances these two objectives. When the cooling gas is turned on the wafer/clamping device interface is pressurized and the gas pressure forces the seal tip into more intimate contact with the backside of the wafer thus tightening the seal interface. The unique geometry of the seal accomplishes this objective without danger of the seal reversing and venting the coolant. The sealing device also allows the cooling grooves in the face of the clamping device, which locally degrade cooling of the wafer, to be entirely eliminated. The sealing device of the invention replaces the cooling grooves with an edge feed system. However, such an edge feed system can only be effectively used in a substantially zero-leakage gas interface. Further, the edge gas feed system according to the invention eliminates the local cooling degradation on the wafer and allows higher RF power to be used for the etch process, resulting in higher etch rates and wafer throughput. An additional advantage is the elimination of the gas distribution groove or grooves on the face of ceramic-faced clamping devices thereby eliminating a costly manufacturing operation and eliminating a structurally compromised area of the ceramic face which is the most probable location for cracking of the ceramic. The S-shaped cross-section and tip design of the seal allow the seal to deflect in a manner that minimizes sliding motion on the back of the wafer while allowing the seal design to fit into the very limited space available. As a result, wafer overhang on the clamping device can be reduced which in turn provides better uniformity of the wafer edge temperature and provides a larger useful area on the wafer for devices to be manufactured.

While the invention has been described in detail with reference to preferred embodiments thereof, it will be apparent to one skilled in the art that various changes can be made, and equivalents employed without departing from the spirit and scope of the invention.

What is claimed is:

1. A clamping apparatus for clamping a substrate in a processing chamber comprising:

electrostatic clamp to hold the substrate to an upper surface of the electrostatic clamp;

an edge ring surrounding the electrostatic clamp and having an upper surface which is substantially co-planar with the upper surface of the electrostatic clamp;

a resilient sealing member provided between the electrostatic clamp and the edge ring and arranged to provide a seal between the electrostatic clamp and the substrate, the sealing member including a base portion which forms a seal between the electrostatic clamp and the edge ring and an upper flexible sealing portion which provides a seal between the electrostatic clamp and the substrate; and one or more channels in the electrostatic clamp opening into a gap between the resilient sealing member and the electrostatic clamp to supply a cooling gas to a space between the surface of the electrostatic clamp and the substrate, wherein the upper flexible sealing portion is an arm extending inwardly so as to be pressurized by the cooling gas.

2. The clamping apparatus of claim 1, wherein the upper surface of the electrostatic clamp has a roughened surface which allows the cooling gas supplied by the channel in the electrostatic clamp to circulate between the electrostatic clamp and the lower surface of the substrate.

3. The clamping apparatus of claim 1, wherein the upper flexible sealing portion has an S-shaped cross section.

4. The clamping apparatus of claim 1, wherein the electrostatic clamp has a groove receiving the base portion of the resilient sealing member.

5. The clamping apparatus of claim 1, wherein the electrostatic clamp provides a clamping force sufficient to cause the substrate to downwardly deflect the flexible sealing portion and maintain a fluid tight seal therebetween.

6. The clamping apparatus of claim 1, wherein the electrostatic clamp is a high voltage electrostatic clamp for holding dielectric substrates.

7. The clamping apparatus of claim 1, wherein the resilient sealing member is formed of silicone.

8. A clamping apparatus for clamping a substrate in a processing chamber comprising:

an electrostatic clamp applying an electrostatic charge to the substrate to hold the substrate to an upper surface of the electrostatic clamp;

a resilient sealing member surrounding the electrostatic clamp and adapted to provide a gas tight seal between the electrostatic clamp and a lower surface of the substrate which is placed on the upper surface of the electrostatic clamp, the sealing member including a base portion which forms a seal between the electrostatic clamp and an edge ring and an upper flexible sealing portion of the resilient sealing member which provides a seal between the electrostatic clamp and the substrate; and a gap for distributing a temperature control as provided between an edge of the electrostatic clamp and the resilient sealing member, wherein the upper flexible sealing portion is an arm extending inwardly so as to be pressurized by the temperature control gas.

9. The clamping apparatus of claim 8, further comprising an insulating edge ring surrounding the electrostatic clamp and the resilient sealing member, the edge ring holding the resilient sealing member in place and electrically isolating the electrostatic clamp from a process gas in the processing chamber.

10. The clamping apparatus of claim 8, wherein the processing chamber is a vacuum chamber and the electrostatic clamp includes at least one channel for providing a cooling gas to a lower surface of the substrate to control the temperature of the substrate.

11. The clamping apparatus of claim 10, wherein the upper surface of the electrostatic clamp has a roughened surface which allows the cooling gas supplied by the channel in the electrostatic clamp to circulate between the electrostatic clamp and the lower surface of the substrate.

12. The clamping apparatus of claim 8, wherein the upper flexible sealing portion is S-shaped in cross-section.

13. The clamping apparatus of claim 8, wherein the electrostatic clamp has a groove receiving the base portion of the resilient sealing member.

14. The clamping apparatus of claim 8, wherein the electrostatic clamp provides a clamping force sufficient to cause the substrate to downwardly deflect the flexible sealing portion and maintain a fluid tight seal therebetween.

15. The clamping apparatus of claim 8, wherein the electrostatic clamp is a high voltage electrostatic clamp for holding dielectric substrates.

16. The clamping apparatus of claim 8, wherein the resilient sealing member is formed of silicone.

17. A method of processing a substrate in a process chamber having an electrostatic clamp for supporting the substrate during processing thereof, the method comprising:

supplying a substrate to the process chamber at a position above the electrostatic clamp, the clamp being surrounded by a resilient sealing member having a flexible sealing portion extending above an upper substrate supporting surface of the clamp, the sealing member including a movable arm portion extending inwardly and engageable with the substrate;

clamping the substrate by supplying sufficient electrical power to the clamp to electrostatically attract the substrate against the upper surface of the clamp, the flexible portion providing a fluid tight seal with a lower surface of the substrate;

supplying cooling gas to a space between the lower surface of the substrate and the upper surface of the clamp by passing helium through one or more channels in the clamp which open into a gap between the sealing member and an outer periphery of the clamp;

pressurizing the movable arm portion of the sealing member against the substrate with the cooling gas; and processing the substrate.

18. The method of claim 17, further comprising supplying a heat transfer gas between the lower surface of the substrate and the upper surface of the clamp.

19. The method of claim 17, wherein the upper surface of the substrate is etched in a plasma environment during the processing step.

20. The method of claim 17, wherein the upper surface of the substrate is coated during the processing step.

21. The method of claim 17, wherein the process chamber is part of an ECR reactor, TCP reactor or parallel plate reactor.

22. The method of claim 17, wherein the clamp is a monopolar electrostatic chuck and the substrate is a glass panel suitable for use in making a flat panel display.

23. The method of claim 17, wherein the clamp is a bipolar electrostatic chuck and the substrate is a semiconductor wafer.

24. The method of claim 17, wherein the clamp is a monopolar electrostatic chuck which is supplied DC voltage of at least 4000 volts during the clamping step.

25. The method of claim 17, wherein the clamp is of aluminum and the upper surface of the clamp is anodized, the method further comprising supplying helium gas between the anodized surface and the lower surface of the substrate.

26. A resilient sealing member for providing a seal with a lower surface of a substrate held on an electrostatic chuck, comprising:

a continuous base portion adapted to engage an outer periphery of an electrostatic chuck and a continuous deflectable portion extending from the base portion, the deflectable portion being deflectable towards the base portion upon engagement with an underside of a substrate positioned on the electrostatic chuck, wherein the deflectable portion is attached to an outer side of the base portion and extends inwardly over the base portion such that cooling gas introduced between the electrostatic chuck and the resilient sealing member causes the deflectable portion to be pressurized against the substrate.

27. The resilient seal of claim 26, wherein the deflectable portion includes an arm and a tip, the arm having one end thereof attached to the outer side of the base portion and the other end of the arm being attached to the tip.

28. The resilient seal of claim 27, wherein the arm extends towards an inner side of the base portion and forms an acute angle with the base portion.

29. The resilient seal of claim 27, wherein the tip includes a curved surface which provides a fluid tight seal with an underside of a substrate held on the electrostatic chuck.

30. The resilient seal of claim 26, wherein the deflectable portion moves vertically under the weight of a semiconductor substrate.

31. The resilient seal of claim 26, wherein the base portion extends in a square, rectangular, or circular path adapted to fit around a similarly shaped electrostatic chuck.

32. The resilient seal of claim 26, wherein the base portion is wedgeshaped and the deflectable portion is S-shaped in cross section.

* * * * *